(12) United States Patent
Cai

(10) Patent No.: US 10,593,260 B1
(45) Date of Patent: Mar. 17, 2020

(54) PIXEL DRIVING CIRCUIT FOR OLED DISPLAY DEVICE AND OLED DISPLAY DEVICE

(71) Applicant: Shenzhen China Star Optoelectronics Semiconductor Display Technology Co., Ltd., Shenzhen, Guangdong (CN)

(72) Inventor: Yuying Cai, Guangdong (CN)

(73) Assignee: Shenzhen China Star Optoelectronics Semiconductor Display Technology Co., Ltd, Shenzhen, Guangdong (CN)

( * ) Notice: Subject to any disclaimer, the term of this patent is extended or adjusted under 35 U.S.C. 154(b) by 291 days.

(21) Appl. No.: 15/750,852

(22) PCT Filed: Sep. 27, 2017

(86) PCT No.: PCT/CN2017/103563
§ 371 (c)(1),
(2) Date: Feb. 7, 2018

(87) PCT Pub. No.: WO2019/033512
PCT Pub. Date: Feb. 21, 2019

(30) Foreign Application Priority Data

Aug. 18, 2017 (CN) .......................... 2017 1 0709578

(51) Int. Cl.
*G09G 5/00* (2006.01)
*G09G 3/3225* (2016.01)
*H01L 27/32* (2006.01)

(52) U.S. Cl.
CPC ....... *G09G 3/3225* (2013.01); *H01L 27/3265* (2013.01); *G09G 2310/0264* (2013.01)

(58) Field of Classification Search
None
See application file for complete search history.

(56) References Cited

U.S. PATENT DOCUMENTS

2010/0073346 A1    3/2010  Min
2011/0164018 A1*   7/2011  Kang ................... G09G 3/3233
                                                        345/211
2017/0249903 A1*   8/2017  Xiang .................. G09G 3/3258

FOREIGN PATENT DOCUMENTS

| CN | 102222468 A | 10/2011 |
| CN | 103915061 A | 7/2014 |
| CN | 104715716 A | 6/2015 |
| CN | 104751771 A | 7/2015 |
| CN | 105761678 A | 7/2016 |
| CN | 105761679 A | 7/2016 |
| CN | 105957473 A | 9/2016 |

(Continued)

*Primary Examiner* — Adam R. Giesy
(74) *Attorney, Agent, or Firm* — Andrew C. Cheng

(57) ABSTRACT

A pixel driving circuit of OLED display device and an OLED display device having the pixel driving circuit are disclosed. The pixel driving circuit adopts a 4T1C pixel structure such that when turning on or turning off, the OLED display device detects the threshold voltage of the driving thin-film transistor, and compensating the threshold voltage being detected into the driving current of the organic light-emitting diode when operates normally such that the present invention is capable of eliminating an affection of the threshold voltage of the driving thin-film transistor to the driving current of the organic light-emitting diode so as to improve the quality of the display image of the OLED display device.

12 Claims, 11 Drawing Sheets

(56) References Cited

FOREIGN PATENT DOCUMENTS

| CN | 106504707 A | 3/2017 |
|---|---|---|
| CN | 106663407 A | 5/2017 |
| CN | 106910466 A | 6/2017 |

\* cited by examiner

PIXEL DRIVING CIRCUIT FOR OLED DISPLAY DEVICE AND OLED DISPLAY DEVICE

BACKGROUND OF THE INVENTION

1. Field of the Invention

The present invention relates to a display technology field, and more particularly to a pixel driving circuit for OLED display device and OLED display device.

2. Description of Related Art

Recently, an Organic Light-Emitting Diode (OLED) display device has become a hot and emerging flat display device at home and abroad. The reason is that an OLED display device has features of self-luminous, wide viewing angle, short response time, high luminous efficiency, wide color gamut, low operating voltage, thin thickness, capable of producing large-size and flexible display device and the simple process. Besides, the OLED display further has a low cost potential.

In an OLED display device, a thin-film transistor (TFT) is adopted to cooperate with a capacitor to store a signal to control a brightness grayscale level of the OLED display device. In order to achieve a constant current driving purpose, each pixel at least requires two TFTs and one storage capacitor, that is, a 2T1C mode. FIG. 1 is a circuit diagram of a pixel driving circuit of a conventional OLED display device. With reference to FIG. 1, the driving circuit of the conventional OLED display device includes two thin-film transistors (TFT) and one capacitor. Specifically, including one switching TFT T1, a driving TFT T2 and one storage capacitor Cst. A driving current of the OLED is controlled by the driving TFT T2, and the magnitude of the driving current is: $I_{OLED}=k(V_{gs}-V_{th})^2$, wherein k is intrinsic conductance factor of the driving TFT T2, and is decided by the characteristic of the driving TFT T2 itself, $V_{th}$ is a threshold voltage of the TFT T2, $V_{gs}$ is a voltage between a gate electrode and a source electrode of the TFT T2. Because of the long time operation, the threshold voltage $V_{th}$ of the driving TFT T2 will generate a drift, the driving current of the OLED will change such that the OLED display device will occur a bad display so as to affect the quality of the display image.

SUMMARY OF THE INVENTION

In order to solve the above technology problem, the purpose of the present invention is to provide a pixel driving circuit and an OLED display device capable of eliminating an affection of the threshold voltage of the driving thin-film transistor to the driving current of the organic light-emitting diode.

According to an aspect of the present invention, providing a pixel driving circuit for OLED display device, comprising: a first thin-film transistor, wherein a gate electrode of the first thin-film transistor T1 is electrically connected to a first node, and a source electrode of the first thin-film transistor is electrically connected to a second node; a second thin-film transistor, wherein a gate electrode of the second thin-film transistor receives a second scanning signal, and a drain electrode of the second thin-film transistor is electrically connected to the first node; a third thin-film transistor, wherein a gate electrode of the third thin-film transistor receives a third scanning signal, a drain electrode of the third thin-film transistor is connected to a drain electrode of the first thin-film transistor, and a source electrode of the third thin-film transistor is electrically connected to a direct-current power positive electrode; a fourth thin-film transistor, wherein a gate electrode of the fourth thin-film transistor receives the first scanning signal, and a drain electrode of the fourth thin-film transistor is electrically connected to the second node; a capacitor, wherein one terminal of the capacitor is electrically connected to the first node, and the other terminal of the capacitor is electrically connected to the second node; an organic light-emitting diode, an anode of the organic light-emitting diode is electrically connected to the second node, and a cathode of the organic light-emitting diode is electrically connected to a direct-current power negative electrode; when the organic light-emitting diode display device is turned off or turned on, the source electrode of the second thin-film transistor receives a first data signal, the source electrode of the fourth thin-film transistor receives an initialization signal or a threshold voltage detector, the threshold voltage detector is used for detecting a threshold voltage of the first thin-film transistor, and generating a threshold voltage signal; when the organic light-emitting diode display device operates normally, the source electrode of the second thin-film transistor receives a second data signal formed by the threshold voltage signal and an original data signal, and the source electrode of the fourth thin-film transistor receives the initialization signal; and wherein each of the initialization signal and the first data signal has a constant low voltage level, and the original data signal has a pulse high voltage level.

Furthermore, when the organic light-emitting diode display device is turned off or turned on, the pixel driving circuit executes a reset operation and a threshold voltage detection operation.

Furthermore, in the reset operation, each of the first scanning signal, the second scanning signal and the third scanning signal is at a high voltage level, and the source electrode of the fourth thin-film transistor receives the initialization signal.

Furthermore, in the threshold voltage detection operation, each of the first scanning signal, the second scanning signal, and the third scanning signal is at a high voltage level, and the source electrode of the fourth thin-film transistor receives the threshold voltage detector.

Furthermore, when the organic light-emitting diode display device displays normally, the pixel driving circuit executes a reset operation, a threshold voltage detection operation, a threshold voltage compensation operation and a driving emitting operation.

Furthermore, in the reset operation, each of the first scanning signal and the second scanning signal is at a high voltage level, the third scanning signal is at a low voltage level, the second data signal is a sum of the reference signal having a low voltage level and the threshold voltage signal.

Furthermore, in the threshold voltage detection operation, the first scanning signal is at low voltage level, each of the second scanning signal and the third scanning signal is at a high voltage level, and the second data signal is a sum of the reference signal having the low voltage level and the threshold voltage signal.

Furthermore, in the threshold voltage compensation operation, each of the first scanning signal and the third scanning signal is at a low voltage level, the second scanning signal is at a high voltage level, and the second data signal is a sum of the displaying data signal having a high voltage level and the threshold voltage signal.

Furthermore, in the driving emitting operation, each of the first scanning signal and the second scanning signal is at a low voltage level, the third scanning signal is at a high voltage level, and the second data signal is a sum of the reference signal having a low voltage level and the threshold voltage signal.

According to another aspect of the present invention, the present invention also provides an OLED display device, including the pixel driving circuit described above.

The beneficial effect of the present invention: the OLED display device of the present invention detect the threshold voltage of the driving thin-film transistor when turning on or turning off, and compensating the threshold voltage being detected into the driving current of the organic light-emitting diode when operates normally such that the present invention is capable of eliminating an affection of the threshold voltage of the driving thin-film transistor to the driving current of the organic light-emitting diode.

BRIEF DESCRIPTION OF THE DRAWINGS

Through following to combine figures to describe in detail, the above, the other purposes, the features and benefits of the exemplary embodiment of the present disclosure will become clearer, wherein.

DETAILED DESCRIPTION OF THE PREFERRED EMBODIMENT

The following content combines with the drawings and the embodiment for describing the present invention in detail. However, many other forms can be used to implement the present invention. Besides, the present invention should not be interpreted to be limit in the specific embodiment described here. On the contrary, the embodiments provided here are used for explaining the operation principle and practical application such that person skilled in the art can under various embodiments of the present invention and various modification suitable for specific applications.

In the figures, in order to illustrate the devices clearly, thickness of the layers and regions are enlarged. A same numeral in the entire specification and figures represents a same device.

Figure 1:
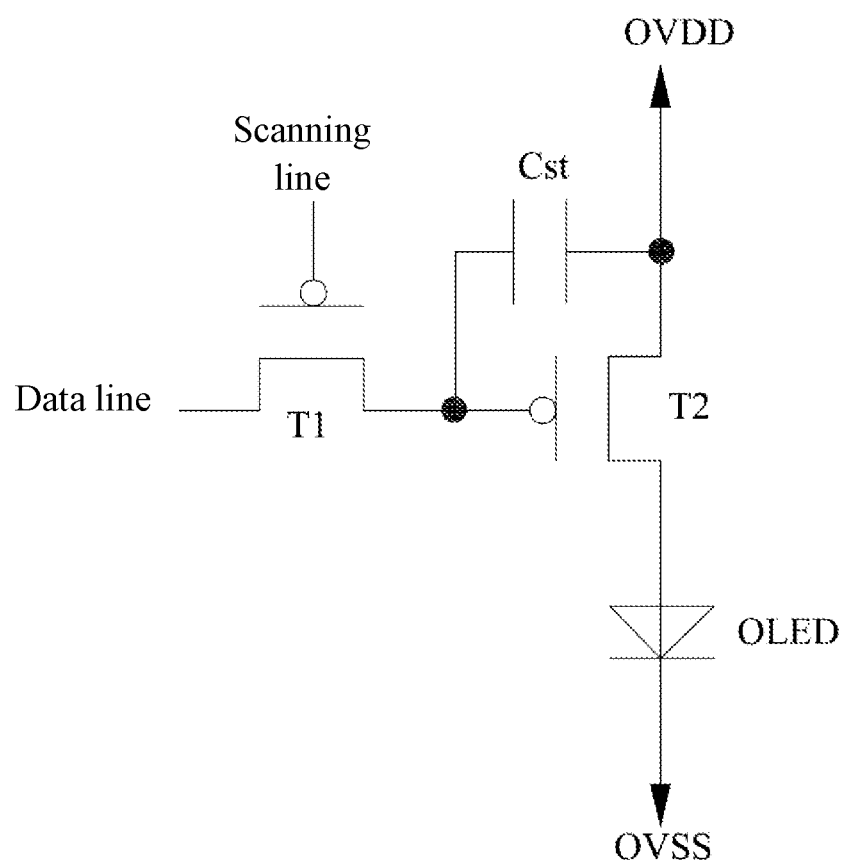
FIG. 1 is a circuit diagram of a pixel driving circuit of a conventional OLED display device.
Figure 2:
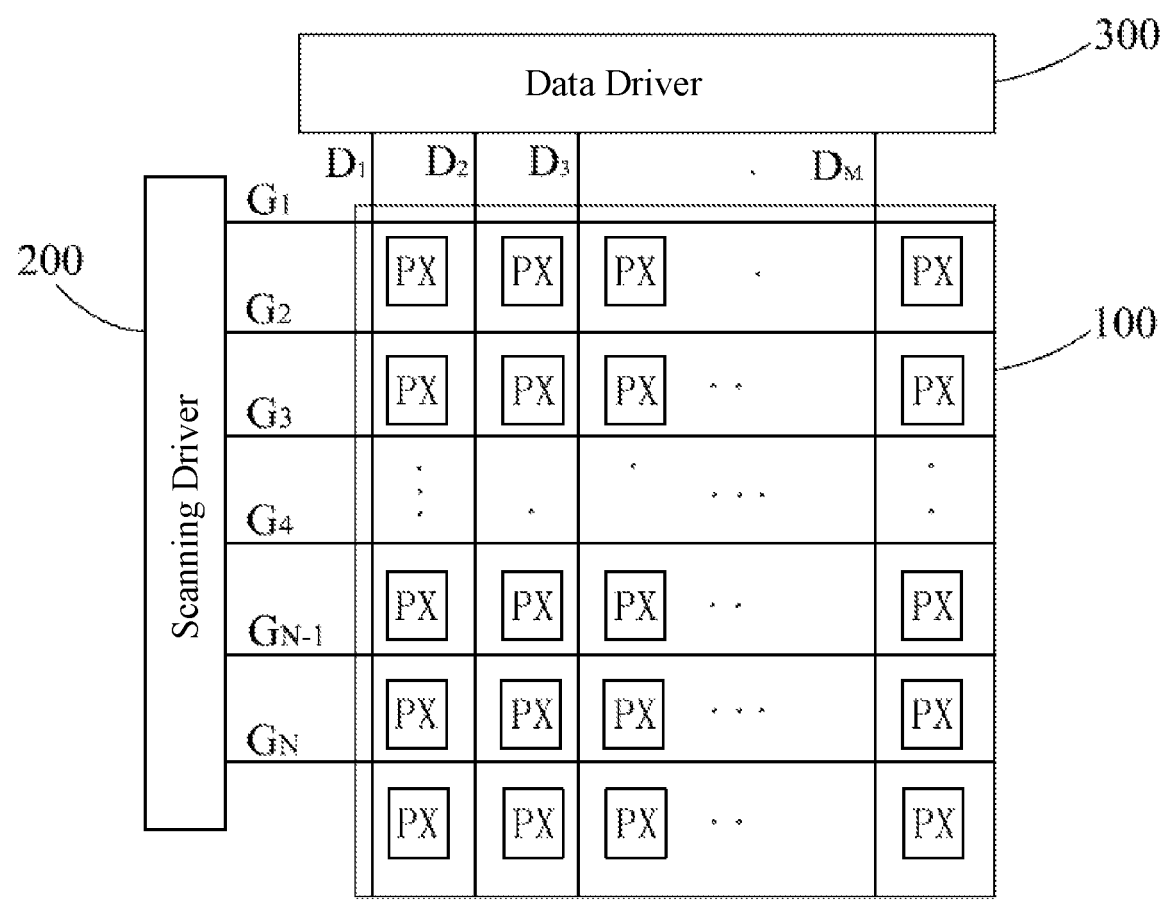
FIG. 2 is a schematic diagram of an organic light-emitting diode display device according to an embodiment of the present invention.

FIG. 2 is a schematic diagram of an organic light-emitting diode display device according to an embodiment of the present invention.

With reference to FIG. 2, the organic light-emitting diode display device includes: a display panel 100, a scanning driver 200 and a data driver 300. It should be noted that the organic light-emitting diode display device according to the present invention can also include the other suitable devices such as a timing controller that controls the scanning driver 200 and the data driver 300 and a power voltage generator for providing a power positive voltage and a power negative voltage.

Specifically, the display panel 100 includes: multiple pixels PX arranged as a matrix, N scanning lines $G_1$ to $G_N$, M data lines $D_1$ to $D_M$. The scanning driver 200 is connected to the scanning lines $G_1$ to $G_N$, and drives the scanning lines $G_1$ to $G_N$. The data driver 300 is connected to the data lines $D_1$ to $D_M$, and drives the data lines $D_1$ to $D_M$.

The scanning driver 200 can provide one or more scanning signals to each pixel PX, and will be illustrated later. The data driver 300 can provide data signal to each pixel PX, and will be illustrated later.

Each pixel includes a pixel driving circuit. The following content will describe the pixel driving circuit (that is, the pixel structure of pixel PX) according to an embodiment of the present invention in detail.

Figure 3:
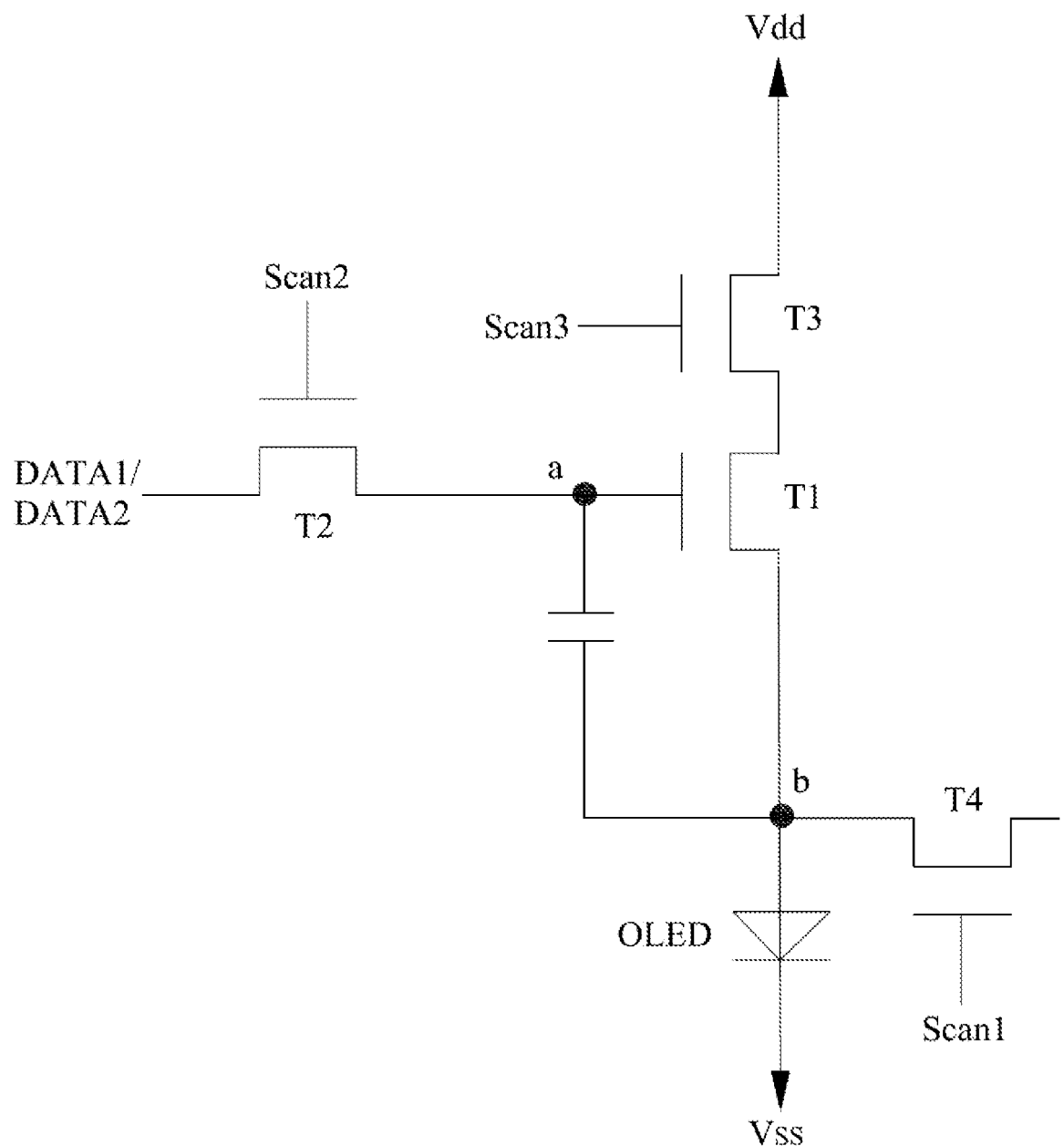
FIG. 3 is an equivalent circuit diagram of a pixel structure of an organic light-emitting diode display device according to an embodiment of the present invention.

FIG. 3 is an equivalent circuit diagram of a pixel structure of an organic light-emitting diode display device according to an embodiment of the present invention.

With reference to FIG. 3, each pixel PX of the organic light-emitting diode display device according to an embodiment of the present invention has a 4T1C pixel structure. The 4T1C pixel structure includes an organic light-emitting diode OLED, a first thin-film transistor T1, a second thin-film transistor T2, a third thin-film transistor T3, a fourth thin-film transistor T4 and a capacitor C.

A gate electrode of the first thin-film transistor T1 is electrically connected to a first node "a", and a source electrode of the first thin-film transistor T1 is electrically connected to a second node "b".

A gate electrode of the second thin-film transistor T2 receives a second scanning signal Scan2, and a drain electrode of the second thin-film transistor T2 is electrically connected to the first node "a".

A gate electrode of the third thin-film transistor T3 receives a third scanning signal Scan3, and a drain electrode of the third thin-film transistor T3 is connected to a drain electrode of the first thin-film transistor T1, and a source electrode of the third thin-film transistor T3 is electrically connected to a direct-current power positive electrode Vdd.

A gate electrode of the fourth thin-film transistor T4 receives the first scanning signal Scan1, and a drain electrode of the fourth thin-film transistor T4 is electrically connected to the second node "b".

One terminal of the capacitor C is electrically connected to the first node "a", and the other terminal of the capacitor C is electrically connected to the second node "b".

An anode of the organic light-emitting diode OLED is electrically connected to the second node "b", and a cathode of the organic light-emitting diode OLED is electrically connected to a direct-current power negative electrode Vss.

Wherein, the first thin-film transistor T1 is a driving thin-film transistor.

When the organic light-emitting diode display device is turned off or turned on (or in a preset period after turning off or turning on), the source electrode of the second thin-film transistor T2 receives a first data signal DATA1, the source electrode of the fourth thin-film transistor T4 receives an initialization signal INI or a threshold voltage detector 400. The threshold voltage detector 400 is used for detecting a threshold voltage Vth of the first thin-film transistor T1, and generating a threshold voltage signal. The specific working process will be described below.

When the organic light-emitting diode display device operates normally (that is, a period after turning on (or a preset time after turning on) to turning off), the source electrode of the second thin-film transistor T2 receives a second data signal DATA2 formed by the threshold voltage signal and an original data signal, and the source electrode of the fourth thin-film transistor T4 receives the initialization signal INI.

In the present embodiment, the initialization signal INI and the first data signal DATA1 has a constant low voltage level, and the original data signal has a unit pulse high voltage level.

Specifically, the first thin-film transistor T1, the second thin-film transistor T2, the third thin-film transistor T3, and the fourth thin-film transistor T4 are all low temperature polysilicon thin-film transistors, oxide semiconductor thin-film trans.

The first scanning signal Scan1, the second scanning signal Scan2, the third scanning signal Scan3, the initialization signal INI, the first data signal DATA1 and the original data signal are all generated through an external timing controller (not shown).

Figure 4:
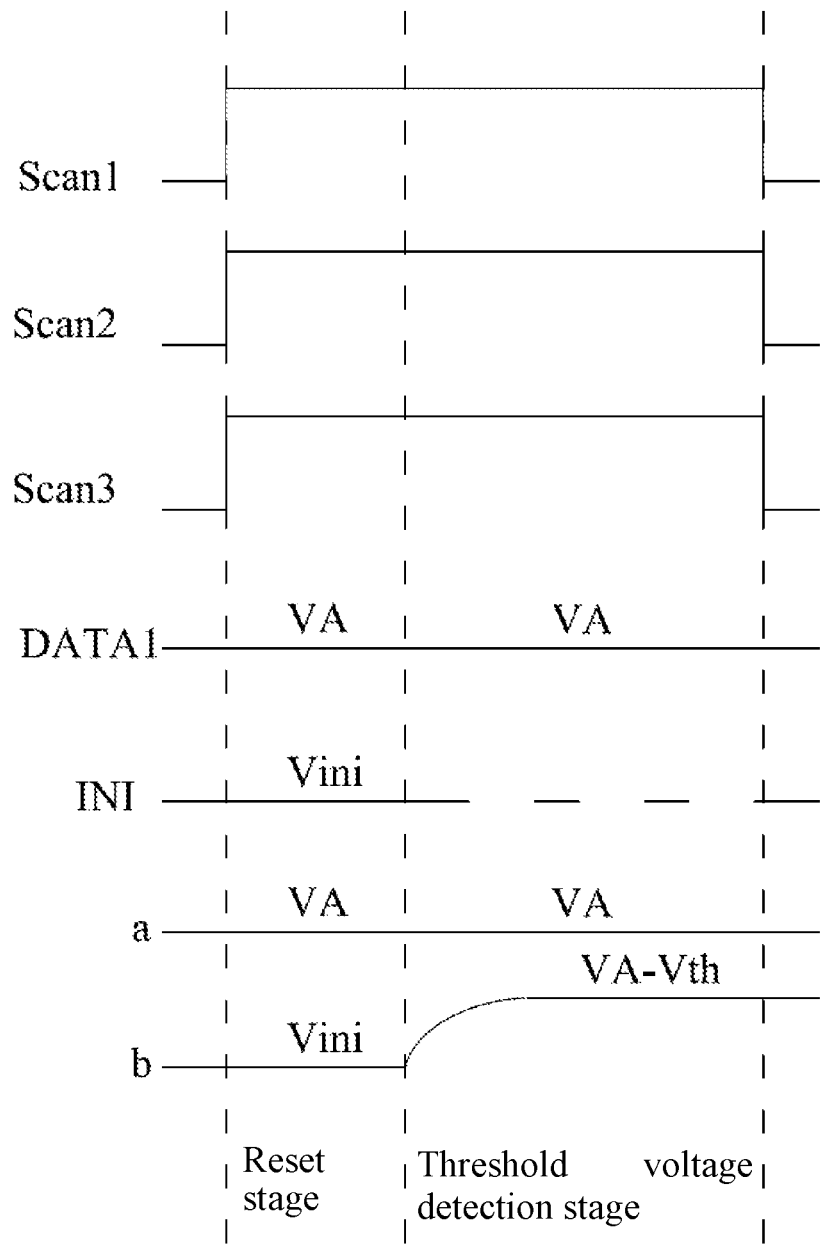
FIG. 4 is a timing diagram of each operation stage of the pixel driving circuit when turning on or off according to an embodiment of the present invention.
Figure 5A:
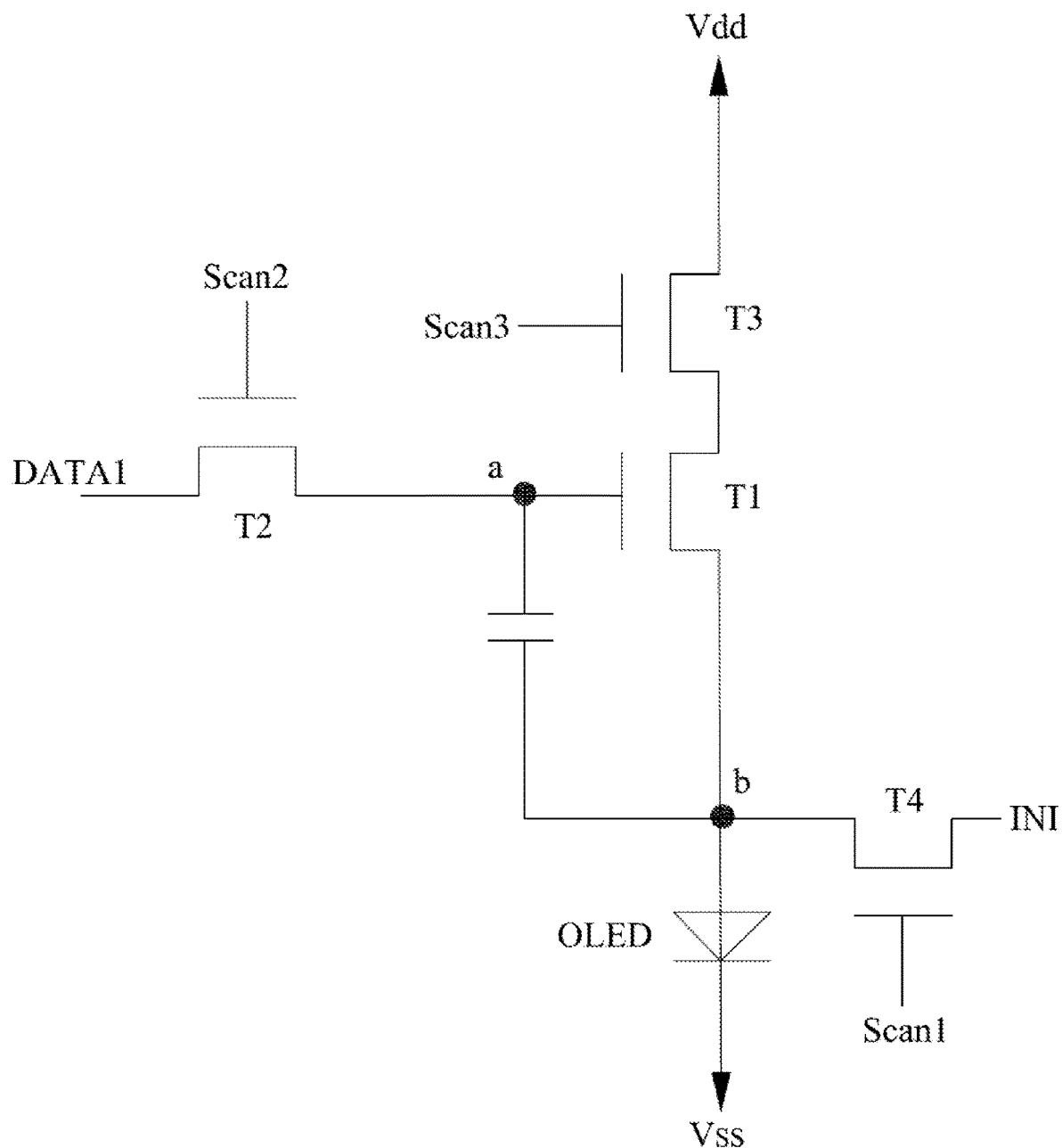
FIG. 5A and FIG. 5B are operation process diagrams of the pixel driving circuit when turning on or turning off according to an embodiment of the present invention.
Figure 5B:
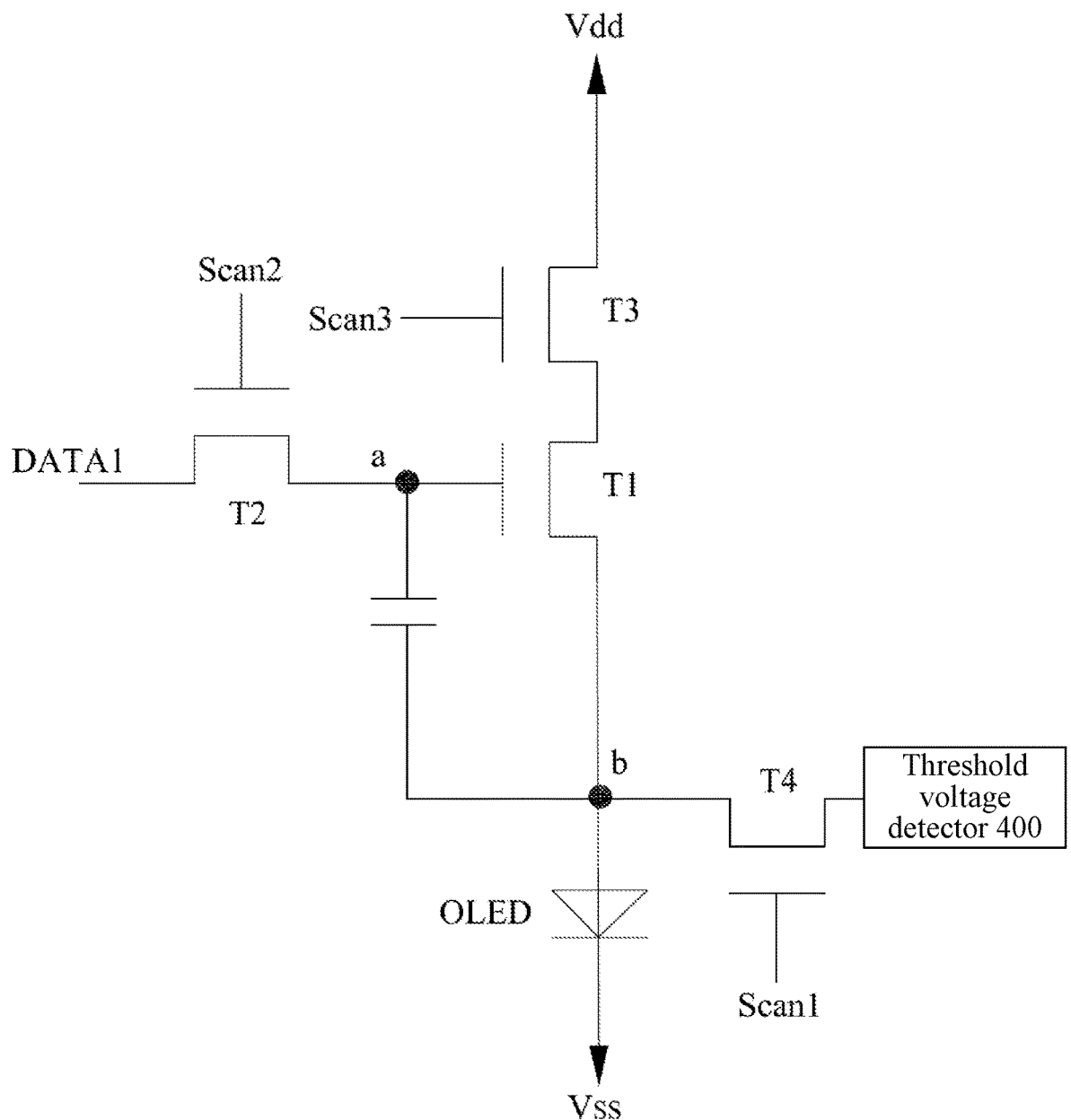

The following will illustrate the operation principle when the pixel driving circuit is turned on or turned off according to an embodiment of the present invention in detail. In the present embodiment, the pixel driving circuit adopting the 4T1C pixel structure according to an embodiment of the present invention execute a reset operation (that is, a reset stage) and a threshold voltage detection operation (that is, a threshold voltage detection stage). FIG. 4 is a timing diagram of each operation stage of the pixel driving circuit when turning on or off according to an embodiment of the present invention. FIG. 5A and FIG. 5B are operation process diagrams of the pixel driving circuit when turning on or turning off according to an embodiment of the present invention.

In a reset stage, with reference to FIG. 4 and FIG. 5A, each of the first scanning signal Scan1, the second scanning signal Scan2 and the third scanning signal Scan3 is at a high voltage level. The first data signal DATA1 is at a low voltage level VA, the source electrode of the fourth thin-film transistor T4 receives the initialization signal INI. The initialization signal INI is at a low voltage level Vini. At this time, the third thin-film transistor T3, the second thin-film transistor T2 and the fourth thin-film transistor T4 are all turned on. The voltage at the first node "a" Va=VA, the voltage at the second node "b" Vb=Vini. Setting Vini=VA in order to finish the initialization.

In the threshold voltage detection stage, with reference to FIG. 4 and FIG. 5B, each of the first scanning signal Scan1, the second scanning signal Scan2 and the third scanning signal Scan3 is at a high voltage level. The first data signal DATA1 is at a low voltage level VA. The source electrode of the fourth thin-film transistor T4 receives the threshold voltage detector 400. At this time, the third thin-film transistor T3, the second thin-film transistor T2 and the fourth thin-film transistor T4 are all turned on. The voltage at the first node "a" Va=VA, the voltage at the second node "b" Vb=VA−Vth so that the voltage sensed by the threshold voltage detector 400 is VA−Vth. Wherein Vth is a threshold voltage of the first thin-film transistor T1. Furthermore, through an internal calculation of the threshold voltage detector 400 such as using the voltage VA to subtract the voltage sensed by the threshold voltage detector 400 in order to obtain the threshold voltage Vth. Then, the threshold voltage detector 400 feedback the threshold voltage Vth being obtained to the original signal in order to overlap with the original data signal to form the second data signal DATA2. The specific process is described below.

Figure 6:
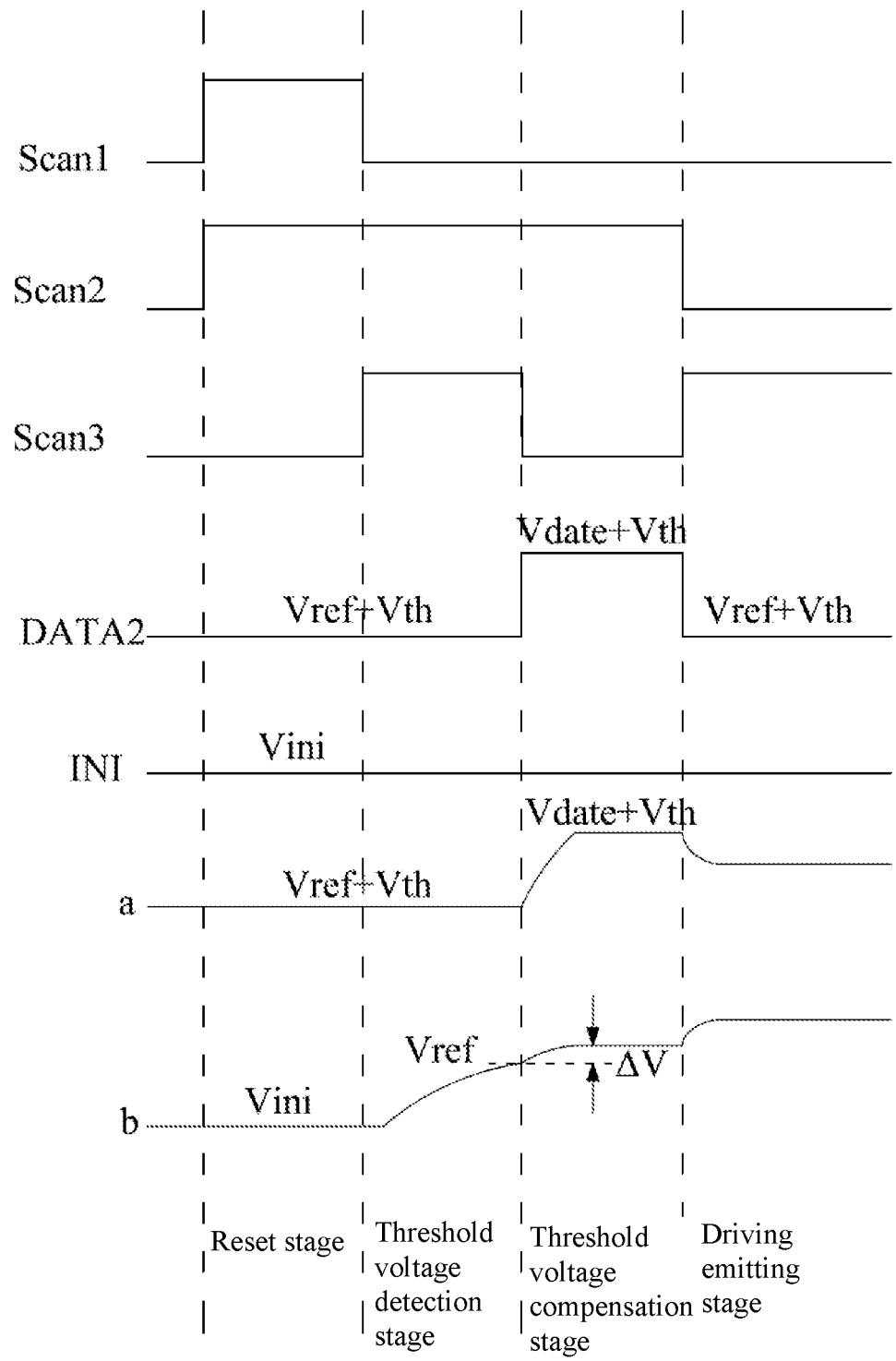
FIG. 6 is a timing diagram of each operation stage when the pixel driving circuit displays normally.

The flowing will describe the operation principle when the pixel driving circuit displays normally according to an embodiment of the present invention, in the present embodiment, the pixel driving circuit adopting the 4T1C pixel structure in the present embodiment of the present invention executes a reset operation (reset stage), a threshold voltage detection operation (threshold voltage detection stage), a threshold voltage compensation operation (that is, a threshold voltage compensation stage) and a driving emitting operation (that is, a driving emitting stage). FIG. 6 is a timing diagram of each operation stage when the pixel driving circuit displays normally. FIG. 7A to FIG. 7D are operation process diagrams of the pixel driving circuit when displaying normally according to an embodiment of the present invention. In FIG. 7A to FIG. 7D, a cross symbol (X) on the thin-film transistor represents that the thin-film transistor is under an off state.

Figure 7A:
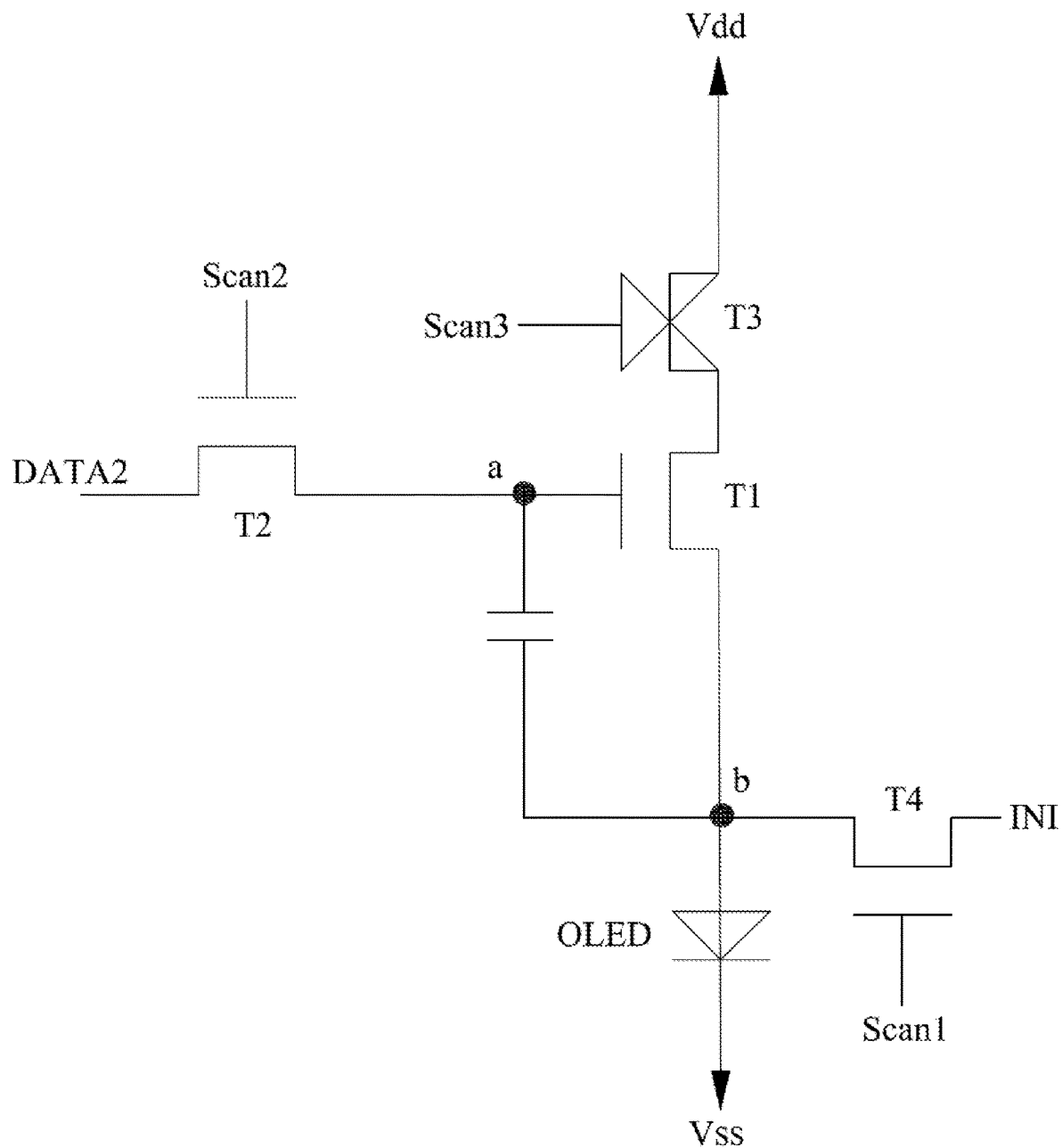
FIG. 7A to FIG. 7D are operation process diagrams of the pixel driving circuit when displaying normally according to an embodiment of the present invention.

In the reset stage, with reference to FIG. 6 and FIG. 7A, each of the first scanning signal Scan1 and the second scanning signal Scan2 is at a high voltage level, the third scanning signal Scan3 is at a low voltage level, the second data signal DATA2 is a sum of the reference signal Vref having a low voltage level and the threshold voltage signal Vth, and the source electrode of the fourth thin-film transistor T4 receives the initialization signal INI. At this time, the third thin-film transistor T3 is turned off, the second thin-film transistor T2 and the fourth thin-film transistor T4 are turned on. The constant low voltage level of the initialization signal INI is inputted to the second node "b" (that is, the source electrode of the first thin-film transistor T1) through the fourth thin-film transistor T4. The second data signal DATA2 is inputted to the first node "a" (that is the gate electrode of the first thin-film transistor T1) through the third thin-film transistor T3 in order to initialize the gate electrode and the source electrode of the first thin-film transistor T to empty a remaining data. The first thin-film transistor T1 is turned off, and the organic light-emitting diode OLED does not emit a light.

In the reset stage:

$$Vg=Va=Vref+Vth$$

$$Vs=Vb=Vini$$

wherein, Vg represents a gate voltage of the first thin-film transistor T1, Va represents a voltage at the first node "a", Vs represent a source voltage of the first thin-film transistor T1, Vb represents a voltage of the second node "b", Vini represent the constant low voltage of the initialization signal INI.

Figure 7B:
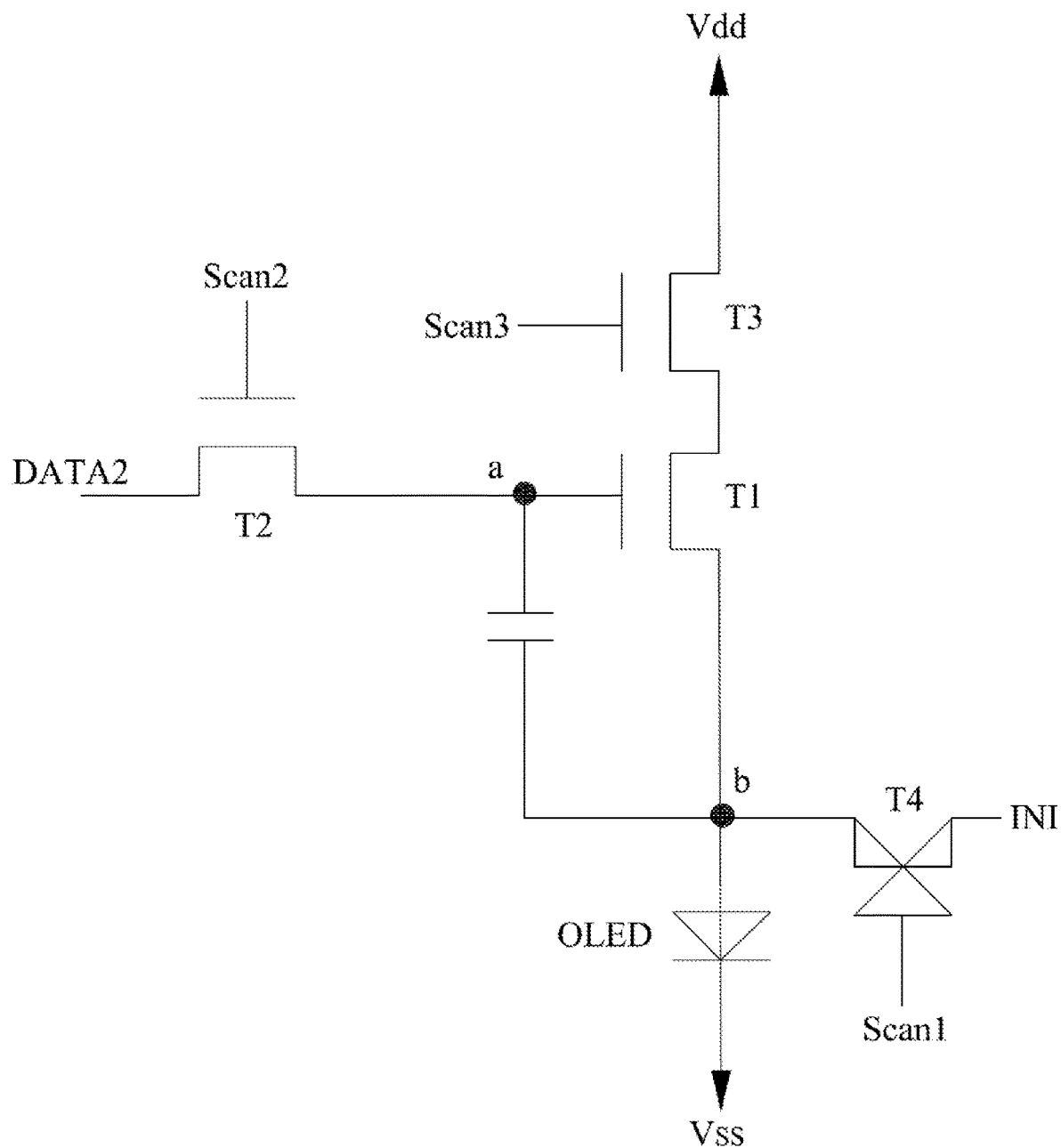

In the threshold voltage detection stage, with reference to FIG. 6 and FIG. 7B, the first scanning signal Scan1 is at low voltage level, each of the second scanning signal Scan2 and the third scanning signal Scan3 is at a high voltage level. The second data signal DATA2 is a sum of the reference signal Vref having a low voltage level and the threshold voltage signal Vth. At this time, the second thin-film transistor T2 and the third thin-film transistor T3 are turned on, and the fourth thin-film T4 is turned off. The gate electrode of the first thin-film transistor T1, that is the first node "a", is inputted with the second data signal DATA2 formed by a sum of the reference signal Vref having the low voltage level and the threshold voltage Vth, and the voltage level at the source voltage of the first thin-film transistor T1, that is the second node "b" becomes Vref.

In the threshold voltage detection stage:

$$Vg=Va=Vref+Vth$$

$$Vs=Vb=Vref$$

Figure 7C:
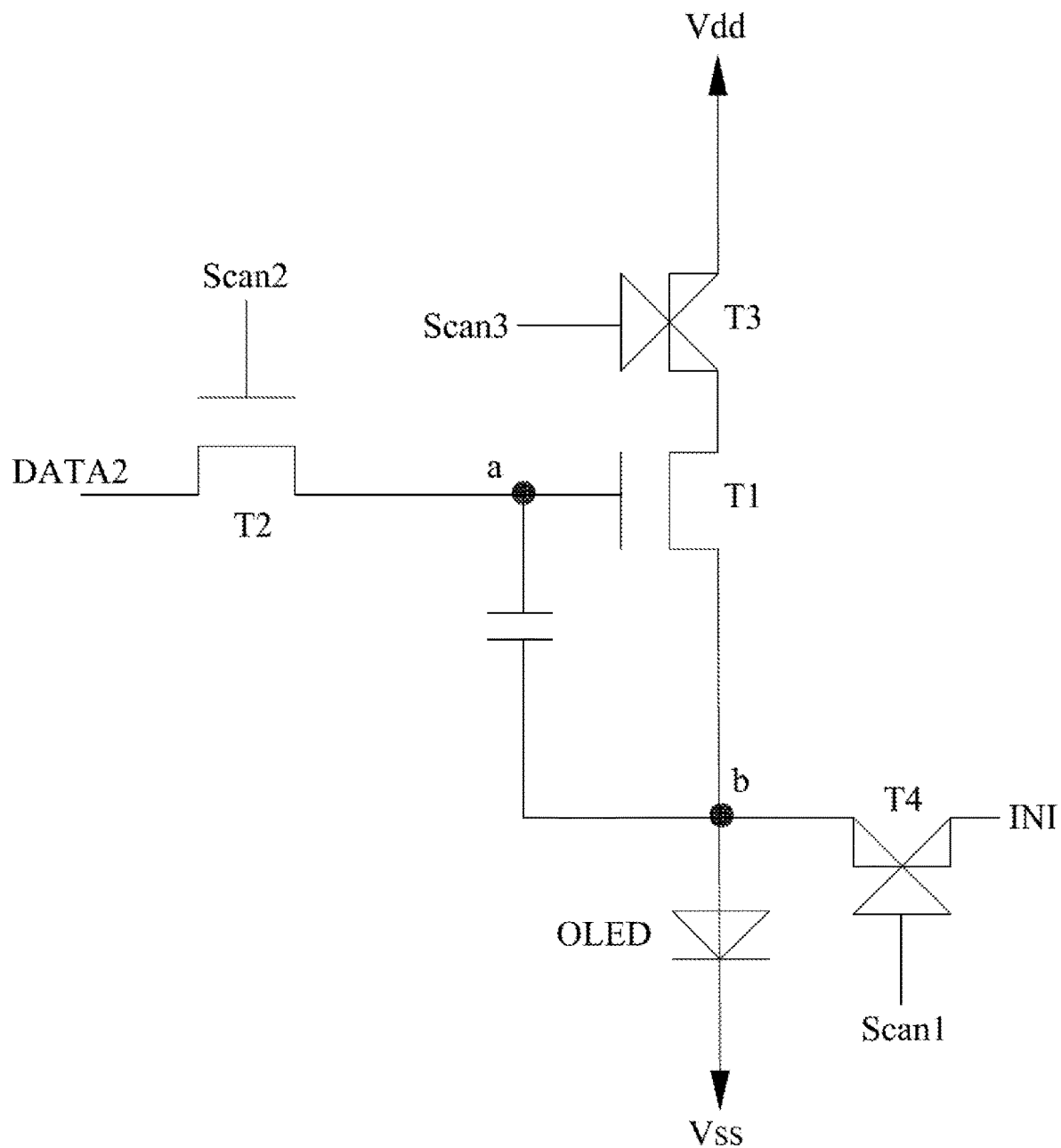

In the threshold voltage compensation stage, with reference to FIG. 6 and FIG. 7C, each of the first scanning signal Scan1 and the third scanning signal Scan3 is at a low voltage level, the second scanning signal Scan2 is at a high voltage level. The second data signal DATA2 is a sum of the displaying data signal Vdata having high voltage level and the threshold voltage signal Vth. At this time, the third thin-film transistor T3 and the fourth thin-film transistor T4 are turned off, the second thin-film transistor T2 is turned on, the second data signal DATA2 inputs the sum of the displaying data signal Vdata having the high voltage level and the threshold voltage Vth to the first node "a" (that is, the gate electrode of the first thin-film transistor T1) and the capacitor C. The voltage level of the source electrode of the first thin-film transistor T1 (that is, the second node "b") becomes Vref+ΔV. Wherein the ΔV is an affection of the displaying data signal Vdata having the high voltage level to the voltage level of the source electrode of the first thin-film transistor T1, and is unrelated to the threshold voltage Vth of the first thin-film transistor.

In the threshold voltage compensation stage:

$$Vg=Va=V\text{data}+Vth$$

$$Vs=Vb=Vref+\Delta V$$

By this way, a difference value between the gate voltage Vg and the source voltage Vs of the first thin-film transistor T1 is:

$$Vgs=Vg-Vs=V\text{data}+Vth-Vref-\Delta V$$

Figure 7D:
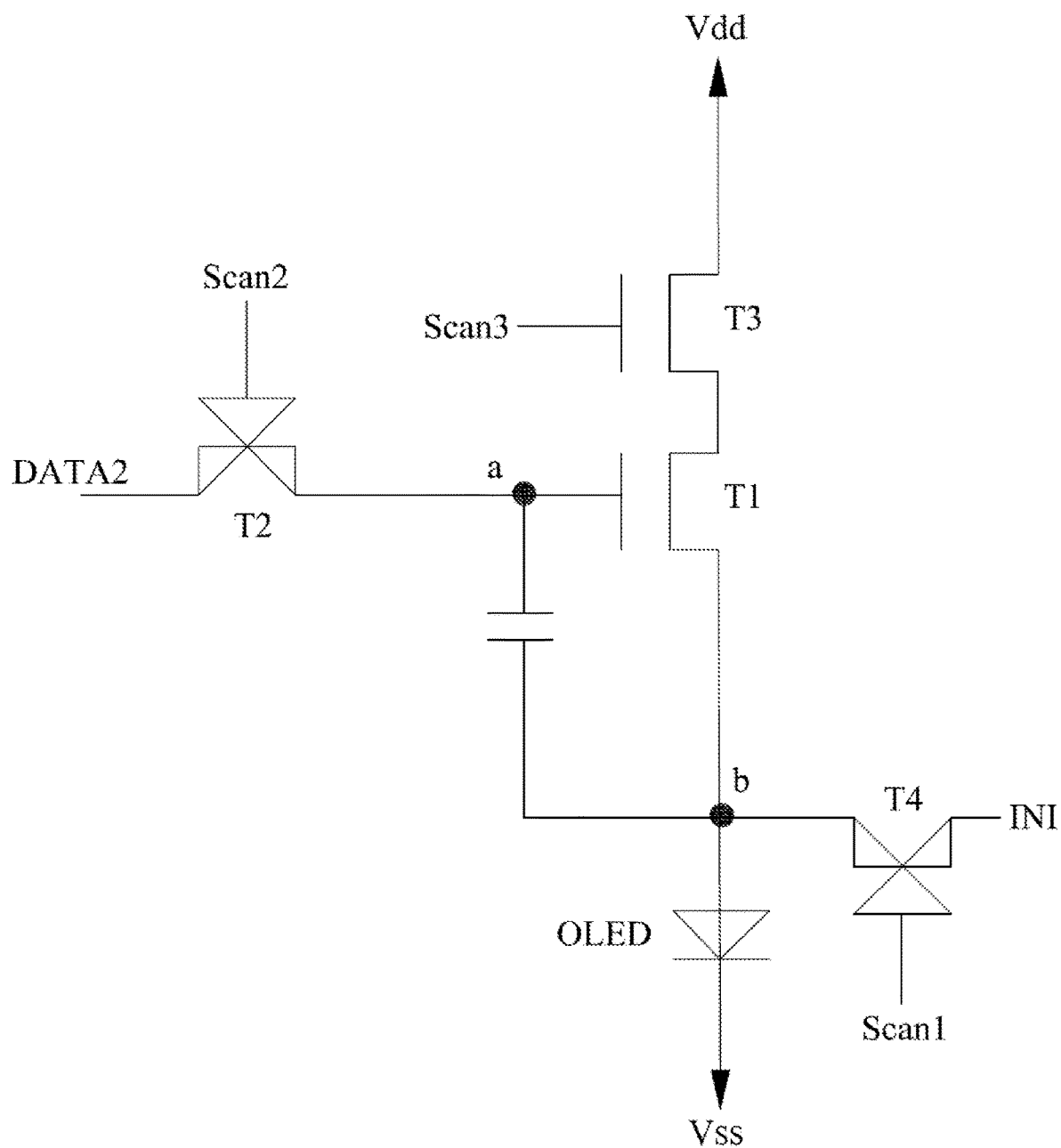

In the driving emitting stage, with reference to FIG. 6 and FIG. 7D, each of the first scanning signal Scan1 and the second scanning signal Scan2 is at a low voltage level, the third scanning signal Scan3 is at a high voltage level. The second data signal DATA2 is a sum of the reference signal Vref having a low voltage level and the threshold voltage signal Vth. At this time, the second thin-film transistor T2 to the fourth thin-film transistor T4 are all turned off. Because of the storage function of the capacitor C, the voltage difference Vgs between the gate voltage Vg (that is the first node "a") and the source voltage Vs (that is the second node "b") of the first thin-film transistor T is unchanged.

Furthermore, the current I flowing through the organic light-emitting diode OLED can be represented as:

$$I=K(Vgs-Vth)^2=K(V\text{data}-Vref-\Delta V+Vth-Vth)^2=K(V\text{data}-Vref-\Delta V)^2$$

Wherein, K represents an intrinsic conductance factor of the first thin-film transistor T1, and is decided by the characteristic of the first thin-film transistor itself.

Accordingly, in the express of the current I flowing through the organic light-emitting diode OLED, the current I is unrelated to the threshold voltage Vth of the first thin-film transistor T such that the bad display generated by the drift of the threshold voltage Vth of the first thin-film transistor T is eliminated.

The above embodiments of the present invention are only exemplary, however, the present invention is not limited. The person skilled in the art can understand: without exceeding the principle and spirit of the present invention, the above embodiments can be changed in form and detail.

What is claimed is:

1. A pixel driving circuit for OLED display device, comprising:
   a first thin-film transistor, wherein a gate electrode of the first thin-film transistor T1 is electrically connected to a first node, and a source electrode of the first thin-film transistor is electrically connected to a second node;
   a second thin-film transistor, wherein a gate electrode of the second thin-film transistor receives a second scanning signal, and a drain electrode of the second thin-film transistor is electrically connected to the first node;
   a third thin-film transistor, wherein a gate electrode of the third thin-film transistor receives a third scanning signal, a drain electrode of the third thin-film transistor is connected to a drain electrode of the first thin-film transistor, and a source electrode of the third thin-film transistor is electrically connected to a direct-current power positive electrode;
   a fourth thin-film transistor, wherein a gate electrode of the fourth thin-film transistor receives the first scanning signal, and a drain electrode of the fourth thin-film transistor is electrically connected to the second node;
   a capacitor, wherein one terminal of the capacitor is electrically connected to the first node, and the other terminal of the capacitor is electrically connected to the second node;
   an organic light-emitting diode, an anode of the organic light-emitting diode is electrically connected to the second node, and a cathode of the organic light-emitting diode is electrically connected to a direct-current power negative electrode;
   when the organic light-emitting diode display device is turned off or turned on, the source electrode of the second thin-film transistor receives a first data signal, the source electrode of the fourth thin-film transistor receives an initialization signal or a threshold voltage detector, the threshold voltage detector is used for detecting a threshold voltage of the first thin-film transistor, and generating a threshold voltage signal;
   when the organic light-emitting diode display device operates normally, the source electrode of the second thin-film transistor receives a second data signal formed by the threshold voltage signal and an original data signal, and the source electrode of the fourth thin-film transistor receives the initialization signal; and
   wherein each of the initialization signal and the first data signal has a constant low voltage level, and the original data signal has a pulse high voltage level.

2. The pixel driving circuit according to claim 1, wherein when the organic light-emitting diode display device is turned off or turned on, the pixel driving circuit executes a reset operation and a threshold voltage detection operation.

3. The pixel driving circuit according to claim 2, wherein in the reset operation, each of the first scanning signal, the second scanning signal and the third scanning signal is at a high voltage level, and the source electrode of the fourth thin-film transistor receives the initialization signal.

4. The pixel driving circuit according to claim 3, wherein in the threshold voltage detection operation, each of the first scanning signal, the second scanning signal, and the third scanning signal is at a high voltage level, and the source electrode of the fourth thin-film transistor receives the threshold voltage detector.

5. The pixel driving circuit according to claim 1, wherein when the organic light-emitting diode display device displays normally, the pixel driving circuit executes a reset operation, a threshold voltage detection operation, a threshold voltage compensation operation and a driving emitting operation.

6. The pixel driving circuit according to claim 5, wherein in the reset operation, each of the first scanning signal and the second scanning signal is at a high voltage level, the third scanning signal is at a low voltage level, the second data signal is a sum of the reference signal having a low voltage level and the threshold voltage signal.

7. The pixel driving circuit according to claim 6, wherein in the threshold voltage detection operation, the first scanning signal is at low voltage level, each of the second scanning signal and the third scanning signal is at a high voltage level, and the second data signal is a sum of the reference signal having the low voltage level and the threshold voltage signal.

8. The pixel driving circuit according to claim 7, wherein in the threshold voltage compensation operation, each of the first scanning signal and the third scanning signal is at a low voltage level, the second scanning signal is at a high voltage level, and the second data signal is a sum of the displaying data signal having a high voltage level and the threshold voltage signal.

9. The pixel driving circuit according to claim 8, wherein in the driving emitting operation, each of the first scanning signal and the second scanning signal is at a low voltage level, the third scanning signal is at a high voltage level, and the second data signal is a sum of the reference signal having a low voltage level and the threshold voltage signal.

10. An OLED display device, wherein the display device includes a pixel driving circuit as claimed in claim 1.

11. The OLED display device according to claim 10, wherein when the OLED display device is turned off or turned on, the pixel driving circuit executes a reset operation and a threshold voltage detection operation;
 wherein in the reset operation, each of the first scanning signal, the second scanning signal and the third scanning signal is at a high voltage level, and the source electrode of the fourth thin-film transistor receives the initialization signal;
 wherein in the threshold voltage detection operation, each of the first scanning signal, the second scanning signal, and the third scanning signal is at a high voltage level, and the source electrode of the fourth thin-film transistor receives the threshold voltage detector.

12. The OLED display device according to claim 10, wherein when the OLED display device displays normally, the pixel driving circuit executes a reset operation, a threshold voltage detection operation, a threshold voltage compensation operation and a driving emitting operation;
 wherein in the reset operation, each of the first scanning signal and the second scanning signal is at a high voltage level, the third scanning signal is at a low voltage level, the second data signal is a sum of the reference signal having a low voltage level and the threshold voltage signal;
 wherein in the threshold voltage detection operation, the first scanning signal is at low voltage level, each of the second scanning signal and the third scanning signal is at a high voltage level, and the second data signal is a sum of the reference signal having the low voltage level and the threshold voltage signal;
 wherein in the threshold voltage detection operation, the first scanning signal is at low voltage level, each of the second scanning signal and the third scanning signal is at a high voltage level, and the second data signal is a sum of the reference signal having the low voltage level and the threshold voltage signal; and
 wherein in the driving emitting operation, each of the first scanning signal and the second scanning signal is at a low voltage level, the third scanning signal is at a high voltage level, and the second data signal is a sum of the reference signal having a low voltage level and the threshold voltage signal.

\* \* \* \* \*